(12) United States Patent
Song et al.

(10) Patent No.: US 10,943,964 B2
(45) Date of Patent: Mar. 9, 2021

(54) DISPLAY SUBSTRATE AND MANUFACTURING METHOD THEREOF, AND DISPLAY APPARATUS

(71) Applicant: BOE TECHNOLOGY GROUP CO., LTD., Beijing (CN)

(72) Inventors: Zhen Song, Beijing (CN); Hongda Sun, Beijing (CN); Guoying Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 123 days.

(21) Appl. No.: 16/335,484

(22) PCT Filed: Apr. 16, 2018

(86) PCT No.: PCT/CN2018/083164
§ 371 (c)(1),
(2) Date: Mar. 21, 2019

(87) PCT Pub. No.: WO2018/192433
PCT Pub. Date: Oct. 25, 2018

(65) Prior Publication Data
US 2019/0245018 A1    Aug. 8, 2019

(30) Foreign Application Priority Data
Apr. 19, 2017  (CN) .......................... 201710256728.4

(51) Int. Cl.
*H01L 27/32* (2006.01)
*H01L 51/52* (2006.01)
*H01L 51/56* (2006.01)

(52) U.S. Cl.
CPC ...... *H01L 27/3246* (2013.01); *H01L 27/3276* (2013.01); *H01L 27/3279* (2013.01); *H01L 51/5253* (2013.01); *H01L 51/56* (2013.01)

(58) Field of Classification Search
None
See application file for complete search history.

(56) References Cited

U.S. PATENT DOCUMENTS

| 6,885,416 B2 | 4/2005 | Luo et al. |
| 9,933,671 B2 | 4/2018 | Dong et al. |
| (Continued) | | |

FOREIGN PATENT DOCUMENTS

| CN | 1527107 A | 9/2004 |
| CN | 104698706 A | 6/2015 |
| CN | 107068719 A | 8/2017 |

OTHER PUBLICATIONS

Search Report and Written Opinion dated Jul. 20, 2018, which issued in coresponding International Patent Application No. PCT/CN2018/083164.

*Primary Examiner* — Anthony Ho
*Assistant Examiner* — Kevin Quinto
(74) *Attorney, Agent, or Firm* — McDermott Will & Emery LLP

(57) ABSTRACT

The present disclosure relates to a display substrate, a manufacturing method thereof, and a display device. The display substrate comprises: a plurality of sub-pixels arranged in an array; a base substrate; and an interlayer insulating layer, at least one heightened part and a plurality of signal wires, sequentially disposed on the base substrate, wherein an orthographic projection of the heightened part on the base substrate is located between orthographic projections of two adjacent sub-pixels on the base substrate, and two adjacent signal wires between the two adjacent sub-pixels are located on two sides of the heightened part and at least partially cover two lateral sides of the heightened part respectively.

16 Claims, 3 Drawing Sheets

(56) References Cited

U.S. PATENT DOCUMENTS

| | | | |
|---|---|---|---|
| 2001/0048491 A1* | 12/2001 | Tanaka | G02F 1/136209 |
| | | | 349/44 |
| 2005/0007524 A1 | 1/2005 | Luo et al. | |
| 2012/0176045 A1* | 7/2012 | Omoto | H01L 27/3276 |
| | | | 315/161 |
| 2017/0108731 A1 | 4/2017 | Dong et al. | |

* cited by examiner

US 10,943,964 B2

DISPLAY SUBSTRATE AND MANUFACTURING METHOD THEREOF, AND DISPLAY APPARATUS

CROSS REFERENCE TO RELATED APPLICATION

The present application is the U.S. National Phase under 35 U.S.C. § 371 of International Application No. PCT/CN2018/083164, filed on Apr. 16, 2018, which claims priority to Chinese Patent Application No. 201710256728.4, filed on Apr. 19, 2017, with a title of "Display substrate and manufacturing method thereof, and display device", the entire contents of each are hereby incorporated by reference.

TECHNICAL FIELD

The present disclosure relates to the technical field of display, and particularly to a display substrate, a manufacturing method thereof, and a display device.

BACKGROUND

At present, in design and manufacture procedures of a bottom emitting type organic light-emitting diode (OLED) display panel fabricated with a top gate type technology, signal wires are typically disposed between two adjacent sub-pixels. Because there is a gap between two signal wires, a light emitted from the light emitting layer will pass through this gap and come out, resulting in light leakage phenomena of the sub-pixels. Usually, the light leakage phenomena are reduced by widening the spacing d between two adjacent sub-pixels. However, in this way, the resolution of the OLED display panel will be significantly influenced, and thus the demand for high resolution cannot be met.

SUMMARY

Embodiments of the present disclosure provide a display substrate comprising a plurality of sub-pixels arranged in an array, wherein the display substrate further comprises a base substrate; and an interlayer insulating layer, at least one heightened part and a plurality of signal wires, sequentially disposed on the base substrate, wherein, an orthographic projection of the heightened part on the base substrate is located between orthographic projections of two adjacent sub-pixels on the base substrate, two adjacent signal wires between the two adjacent sub-pixels are located on two sides of the heightened part, and the two adjacent signal wires at least partially cover two lateral sides of the heightened part respectively.

Optionally, the display substrate further comprises a passivation layer and a color film layer sequentially disposed above the plurality of signal wires, wherein a side of the passivation layer away from the base substrate, corresponding to the heightened part, is aligned with a side of the color film layer away from the base substrate.

Optionally, the display substrate further comprises a planarization layer, an anode layer, a pixel defining layer, a light emitting layer and a cathode layer, sequentially disposed above the color film layer, wherein the anode layer and the light emitting layer, are disposed in lamination and located in a sub-pixel region, the pixel defining layer surrounds edges of the anode layer and the light emitting layer, a side of the pixel defining layer close to the base substrate is aligned with a side of the anode layer close to the base substrate, and a side of the pixel defining layer away from the base substrate is aligned with a side of the light emitting layer away from the base substrate, and both the planarization layer and the cathode layer have a parallel whole layer structure.

Optionally, the cathode layer is a reflective cathode layer.

Optionally, the two signal wires cover a side of the heightened part away from the base substrate, and there is a gap between the two signal wires.

Optionally, the signal wire comprises at least one of the following wires:

a data wire, a power wire, or an external compensation signal wire.

Optionally, a section of the heightened part in a direction perpendicular to the base substrate has a trapezoid or rectangle shape.

Optionally, the heightened part has a thickness of 1 μm to 2 μm.

Optionally, the material for the heightened part is at least one of the following materials: a polysiloxane-based material, an acrylic material, or a polyimide-based material.

Embodiments of the present disclosure further provide a display device comprising any one of the above-described display substrates provided in the embodiments of the present disclosure.

Optionally, the display device is a bottom emitting type display device or a double-side display type display device.

Embodiments of the present disclosure further provide a manufacture method of any one of the above-described display substrates provided in the embodiments of the present disclosure, comprising:

forming an interlayer insulating layer on a base substrate;

applying a layer of heightening thin film, subjecting the heightening thin film to exposure and development processes, to form at least one heightened part between two adjacent sub-pixels;

baking the heightened part formed to increase its hardness;

forming an interlayer insulating layer pattern; and forming a plurality of signal wires on the base substrate with the heightened part formed thereon, such that two adjacent signal wires between the two adjacent sub-pixels are located on two sides of the heightened part, and the two adjacent signal wires at least partially cover two lateral sides of the heightened part respectively.

Optionally, before forming the plurality of signal wires on the base substrate with the heightened part formed thereon, the manufacturing method further comprises a step of baking the heightened part formed to increase its hardness.

Optionally, before forming the plurality of signal wires on the base substrate with the heightened part formed thereon, the manufacturing method further comprises a step of forming an interlayer insulating layer pattern.

Optionally, the step of forming the interlayer insulating layer pattern comprises making via holes in the interlayer insulating layer.

DETAILED DESCRIPTION

Figure 1:
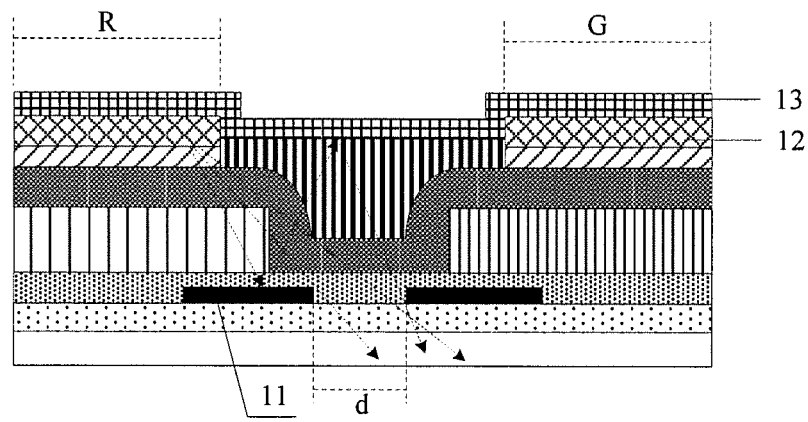
FIG. 1 is a schematic sectional structure diagram of a display substrate in related art.

The technical solutions of the embodiments of the present disclosure and the related art will be clearly described below with reference to the drawings. Obviously, the embodiments of the present disclosure described are only a part of, but not all of the embodiments of the present disclosure. All of other embodiments obtained by those skilled in the art based on the embodiments of the present disclosure, without inventive efforts, fall within the protection scope of the present application.

Here, the thickness of a film layer and the shape of a region in the drawings do not indicate a real proportion, and are only intended to schematically illustrate the present disclosure.

FIG. 1 is a schematic sectional structure diagram of a top gate type bottom emitting OLED display substrate in the related art. As shown in FIG. 1, signal wires 11 are typically disposed between two adjacent sub-pixels R and G Because there is a gap between two signal wires 11, a light emitted from light emitting layer 12 will pass through this gap and come out, resulting in light leakage phenomena of the sub-pixels. Particularly for the bottom emitting display mode, it requires forming a reflective cathode 13 by depositing a metal on the light emitting layer 12. As such, a light emitted from the light emitting layer 12 irradiates on the signal wires, and then is reflected onto the reflective cathode 13, which will aggravate the light leakage phenomena.

Therefore, the problem to be urgently solved is how to avoid the light leakage phenomena between two adjacent sub-pixels, without influencing the resolution of OLED display panel.

The embodiments of the present disclosure provide a display substrate suitable for a bottom emitting type or a double-side display type display substrate, mainly by further disposing a heightened part under the signal wires on the basis of the related display substrate and allowing two signal wires cover two lateral sides of the heightened part respectively. As such, because the signal wires typically have an opaque structure, the light emitted from the lateral side of the light emitting layer can be effectively blocked, avoiding the light leakage phenomena between two adjacent sub-pixels. The display substrate, the manufacturing method thereof, and the display device provided in the embodiments of the present disclosure will be described in detail below.

Figure 2:
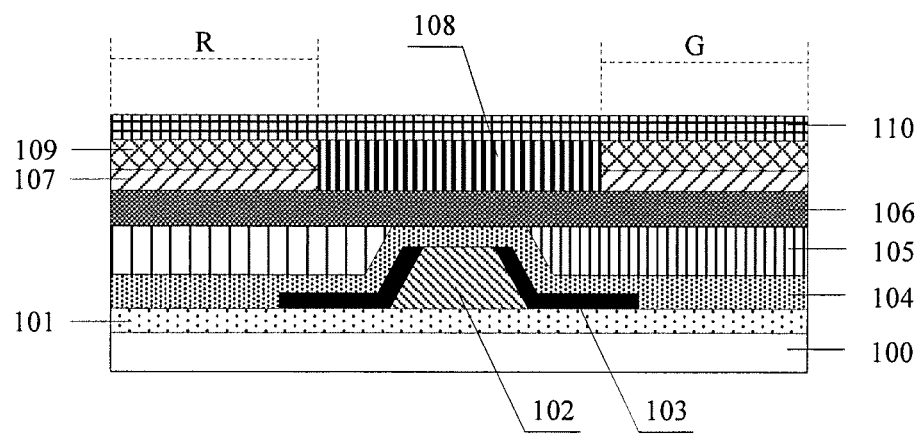
FIG. 2 is a schematic sectional structure diagram of a display substrate provided in an embodiment of the present disclosure.

FIG. 2 is a schematic sectional structure diagram of a display substrate provided in an embodiment of the present disclosure. The display substrate comprises a plurality of sub-pixels arranged in an array. The display substrate further comprises: a base substrate 100; and an interlayer insulating layer 101, at least one heightened part 102 and a plurality of signal wires 103, sequentially disposed on the base substrate 100, wherein an orthographic projection of the heightened part 102 on the base substrate 100 is located between orthographic projections of two adjacent sub-pixels (R and G) on the base substrate 100 and between orthographic projections of two adjacent signal wires 103 on the base substrate 100, and the two signal wires 103 at least partially cover two lateral sides of the heightened part 102 respectively.

FIG. 2 only simply illustrates a part of the sectional structure of the display substrate between two adjacent sub-pixels. Since the structures between pixels are similar to each other, the detailed structure of the whole display substrate is not illustrated here. Meanwhile, FIG. 2 only depicts a part of the main structure of one sub-pixel. For example, FIG. 2 does not depict the structure of thin film transistor (TFT), the structure between the interlayer insulating layer and the base substrate, other film layers on the cathode layer (such as the reflective cathode layer), and so on. All these structures which are not depicted may be configured as required, and will not be described here.

In particular implementations, to avoid light leakage phenomena often occurred between two adjacent sub-pixels (R and G), a heightened part 102 is disposed in the display substrate. In order to not influence the normal light emitting of the display substrate, the heightened part 102 is disposed below pixel defining layer 108. That is, an orthographic projection of the heightened part 102 on the base substrate 100 is located between orthographic projections of two adjacent sub-pixels (R and G) on the base substrate 100. Meanwhile, since two signal wires 103 are allowed to extend to two lateral sides of the heightened part 102, the heightened part is disposed such that an orthographic projection of the heightened part on the base substrate is between orthographic projections of the two signal wires on the base substrate. Since the signal wire typically has an opaque structure (the signal wire is typically a metal wire), the signal wires on two sides of the heightened part can effectively block the light emitted from lateral side of light emitting layer 109 and the light reflected by cathode layer 110.

The particular manner for disposing the heightened part may be set according to the arrangement of different signal wires in the display substrate and the light leakage condition between adjacent sub-pixels. Here, the signal wires may comprise a part or all of the following wires: a data wire, a power wire (such as a VDD wire), or an external compensation signal wire. For example, a heightened part may be disposed between every two adjacent sub-pixels. Alternatively, a heightened part may be disposed between two signal wires when the two signal wires are disposed between two adjacent sub-pixels. When a relatively wide external compensation signal wire is disposed between two adjacent sub-pixels, the light leakage phenomena is not likely to occur, and thus a heightened part may not be disposed.

In the related art, the light leakage phenomena are usually reduced by widening the spacing between two adjacent sub-pixels. However, in this way, the resolution of the OLED display panel will be significantly influenced, and the demand for high resolution cannot be met. In the display substrate provided in the embodiments of the present disclosure, a heightened part is disposed between two signal wires, so as to fully make use of the space in vertical direction of the display substrate for achieving the light-blocking effect, without changing the width and thickness of other film layers. As a result, it broadens the design allowance of the display substrate. Further, the light leakage problem can be solved without influencing resolution, improving the quality of the display image.

In addition to the interlayer insulating layer, the heightened part and the signal wires as described above, the display substrate provided in the embodiments of the present disclosure may comprise a passivation layer and a color film layer. As shown in FIG. 2, the display substrate further comprises a passivation layer 104 and a color film layer 105 sequentially disposed above the plurality of signal wires 103, wherein a side of the passivation layer 104 away from the base substrate 100, corresponding to the heightened part 102, is aligned with a side of the color film layer 105 away from the base substrate 100.

In particular implementations, because a heightened part is added between the interlayer insulating layer and the signal wires, and a whole layer of passivation layer 104 is above the heightened part in the display substrate provided in the embodiments of the present disclosure, the upper surface (i.e., the side away from the base substrate) of the passivation layer right above the heightened part may be allowed to be aligned with the upper surface (i.e., the side away from the base substrate) of the color film layer corresponding to respective sub-pixel regions. This is beneficial for improving the flatness of the upper planarization layer in the deposition, and the segment difference phenomena as shown in FIG. 1 will not occur any more, solving the problem of poor flatness due to height difference in the vertical direction. Meanwhile, the morphologies of the deposited anode layer and pixel defining layer can be further improved, thereby reducing the display mura and increasing the yield of the display substrate.

Further, in the display substrate provided in the embodiments of the present disclosure, after adding the heightened part, the structures of other film layers can also be improved. As shown in FIG. 2, the display substrate may further comprise a planarization layer 106, an anode layer 107, a pixel defining layer 108, a light emitting layer 109 and a cathode layer 110 sequentially disposed on the color film layer, wherein the anode layer 107 and the light emitting layer 109 are disposed in lamination and located in sub-pixel regions (the regions indicated by R and G in FIG. 2), the pixel defining layer 108 surrounds edges of the anode layer 107 and the light emitting layer 109, a side of the pixel defining layer 108 close to the base substrate 100 is aligned with a side of the anode layer 107 close to the base substrate 100, a side of the pixel defining layer 108 away from the base substrate 100 is aligned with a side of the light emitting layer 109 away from the base substrate 100, and both the planarization layer 106 and the cathode layer 110 have a parallel whole layer structure.

That is, the display substrate provided in the embodiments of the present disclosure further comprises: a planarization layer 106; and an anode layer 107, a pixel defining layer 108, a light emitting layer 109 and a cathode layer 110, of which the OLED device is composed. FIG. 2 comprises two sub-pixel regions R and G, each of which comprises an anode layer 107 and a light emitting layer 109 disposed in lamination. The two sub-pixel regions R and G are separated from each other by the pixel defining layer 108. The upper surface of the pixel defining layer is allowed to be aligned with the upper surface of the light emitting layer, and the lower surface of the pixel defining layer is allowed to be aligned with the lower surface of the anode layer. As such, not only the flatness of the planarization layer 106 can be improved, but also the cathode layer 110 can be allowed to have a parallel whole layer structure.

In particular implementations, for the display substrate of the related art as shown in FIG. 1, there is a problem of passivation layer sagging between two signal wires, so that the position of the uppermost reflective cathode is lowered, which would be prone to causing a problem of light leakage due to reflected light. In the embodiments of the present disclosure, a heightened part is disposed in the display substrate, which improves the flatness of the passivation layer while increasing the height from the cathode layer to the base substrate between two sub-pixels, thereby effectively reducing the problem of light leakage due to the reflected light.

Figure 3:
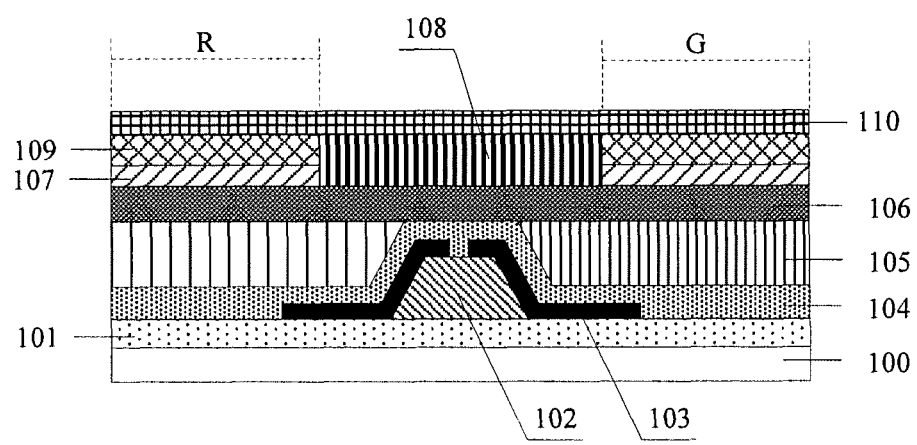
FIG. 3 is a schematic sectional structure diagram of another display substrate provided in an embodiment of the present disclosure.

In the display substrate as shown in FIG. 2, two signal wires only cover two lateral sides of the heightened part respectively. However, in order to further increase the width of the signal wires, a structure as shown in FIG. 3 may be formed. FIG. 3 is a schematic sectional structure diagram of another display substrate provided in an embodiment of the present disclosure, wherein two signal wires cover a side of the heightened part away from the base substrate, and there is a gap between the two signal wires.

In particular, as shown in FIG. 3, the two signal wires not only cover two lateral sides of the heightened part, but also cover a part of the upper surface of the heightened part. However, it is required to ensure that there is a gap between the two signal wires without influencing the signal transmission. In the display substrate provided in the embodiments of the present disclosure, the signal wires are lapped on a portion of the heightened part, and in addition to the light-blocking effect, such designed signal wires increase the wire width of the signal wires, and reduce the parasitic resistance of the signal wires, which is beneficial for reducing the problems such as uneven brightness of the display image due to RC delay and resistance voltage drop.

In particular implementations, in order for the best effect of the heightened part, the thickness thereof should be set according to the thickness of the color film layer and the passivation layer, so that the flatness of the planarization layer can be improved. Optionally, the heightened part has a thickness of 1 μm to 2 μm. In addition, the length of the heightened part in a direction in parallel with the base substrate may be set according to the length of corresponding signal wires. For example, it is configured that the length of the heightened part is equal to the length of the signal wires.

The particular shape of the heightened part may also be configured as required. As the signal wires are required to be lapped onto the lateral sides of the heightened part, the section of the heightened part in a direction perpendicular to the base substrate may have a trapezoid or rectangle shape, in order to prevent the signal wires from being prone to breakage due to a too large bending angle. When the section of the heightened part in the direction perpendicular to the base substrate has a trapezoid shape, preferably, two signal wires also cover a part of the upper surface of the heightened part, so as to further improve the light-blocking effect.

In addition, the material of the heightened part may be selected as required. Because the heightened part is located between two signal wires, the width in practical manufacture is relatively small. Therefore, in consideration of the problem of manufacture process, the material for the heightened part may be one of the following materials or a combination thereof a polysiloxane-based material, an acrylic material, or a polyimide-based material. In the manufacture of the heightened part, the same material as that for the planarization layer may be used, without introducing any new material, which is beneficial for saving cost. Meanwhile, in order to not influence the film layer arrangement above the heightened part, it is required to select a material with a higher hardness to manufacture the heightened part. For example, silicone among the polysiloxane-based materials may be selected and used to manufacture the heightened part.

Based on the same inventive concept, the embodiments of the present disclosure further provide a display device comprising any one of the above-described display substrates provided in the embodiments of the present disclosure. The implementation of the display device can refer to the embodiment of any one of the display substrates described above, and the repeating part will not be reiterated.

The embodiments of the present disclosure further provide a manufacturing method of any one of the display substrates described above provided in the embodiments of the present disclosure. Because the principle by which the manufacturing method solves problems is similar to that of the display substrate provided in the embodiments of the present disclosure, the implementation of the manufacturing method can refer to the implementation of the display substrate, and the repeating part will not be reiterated.

Figure 4:
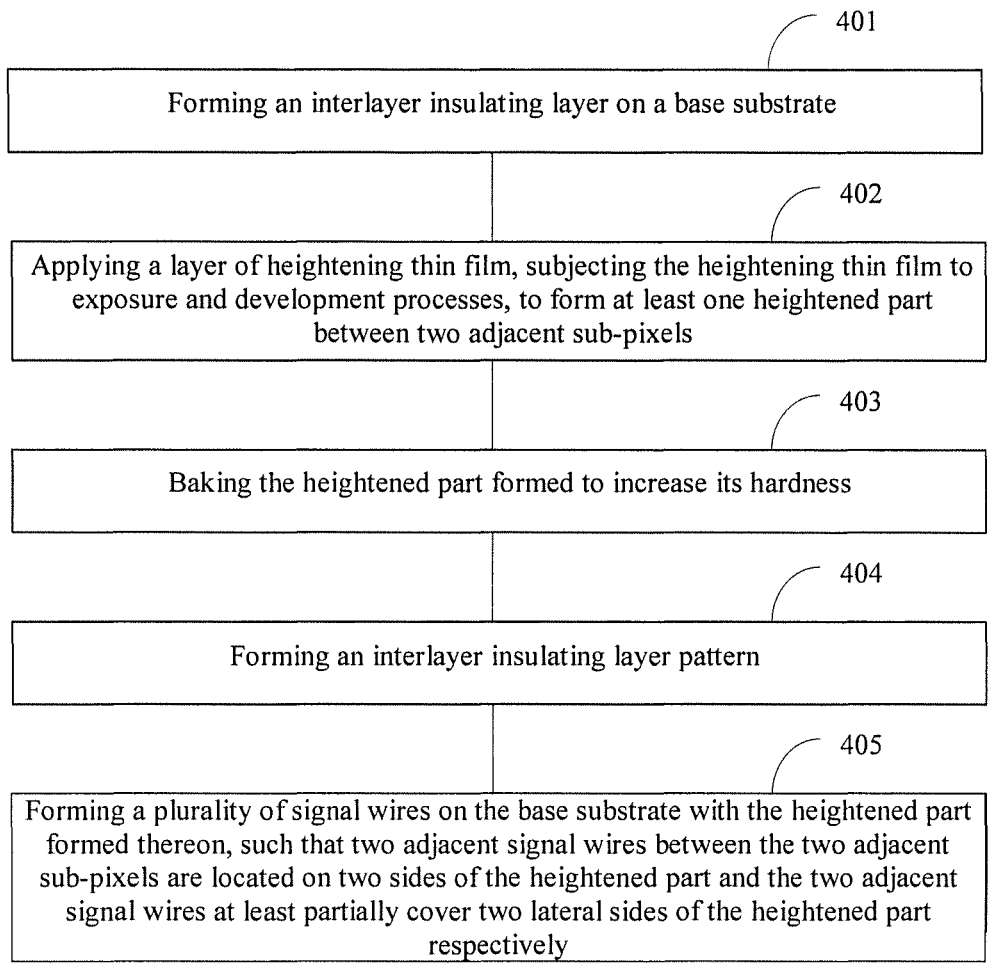
FIG. 4 is a flow chart of a manufacturing method of a display panel provided in an embodiment of the present disclosure.

FIG. 4 is a flow chart of a manufacturing method of a display panel provided in an embodiment of the present disclosure. Particularly, the method may comprise the following steps:

Step 401: forming an interlayer insulating layer on a base substrate;

Step 402: applying a layer of heightening thin film on the interlayer insulating layer, subjecting the heightening thin film to exposure and development processes, to form at least one heightened part between two adjacent sub-pixels;

Step 403: baking the heightened part formed to increase its hardness;

Step 404: forming an interlayer insulating layer pattern; and

Step 405: forming a plurality of signal wires on the base substrate with the heightened part formed thereon, such that two adjacent signal wires between the two adjacent sub-pixels are located on two sides of the heightened part and the two adjacent signal wires at least partially cover two lateral sides of the heightened part respectively.

In particular implementations, the lamination structure of the display substrate manufactured in the embodiments of the present disclosure may be, from top to bottom in sequence: an interlayer insulating layer, a heightened part, signal wires, a passivation layer, a color film layer, a planarization layer, an anode layer, a pixel defining layer, a light emitting layer and a cathode layer. In practical manufacture, except the added heightened part, other film layers can be manufactured with the process in the related art. The manufacture processes of various film layers are briefly described below.

In practice, it is required to form a TFT structure on the base substrate, before carrying out Step 401. The formation of the TFT structure is not specifically described here, as the TFT structure formed has no substantial influence on the present disclosure. A whole layer of interlayer insulating layer is formed on the base substrate with the TFT structure formed thereon.

When carrying out Step 402, the heightened part is manufactured on the interlayer insulating layer formed. In particular manufacture, a layer of material for heightening, such as a polysiloxane-based material, an acrylic material or a polyimide-based material, is applied onto the interlayer insulating layer. Then, the heightening layer is subjected to exposure and development processes, to form at least one heightened part between two adjacent sub-pixels.

After forming the heightened part, since the heightened part is typically made from an organic material with a relatively low hardness, it is further required to increase the hardness of the heightened part in order to not influence the manufacture of the film layers above. For example, Step 403 may be carried out to bake the heightened part formed so as to increase its hardness.

In the process for manufacturing signal wires after forming the heightened part, since some signal wires are manufactured in the same layer as the source/drain electrodes of the TFT structure, it is required to make via holes for the source/drain electrodes in the interlayer insulating layer, that is, to carry out Step 404 of forming an interlayer insulating layer pattern, before manufacturing the signal wires.

Then, a metal layer for manufacturing signal wires and source/drain electrodes is deposited on the film layer in which the heightened part is located, a photoresist is applied on the metal layer, and the pattern of the source/drain electrodes and the pattern of the signal wires are formed by etching, and consequently, a plurality of signal wires are formed on the base substrate with the heightened part formed thereon, such that two adjacent signal wires between the two adjacent sub-pixels are located on two sides of the heightened part respectively, and meanwhile the two adjacent signal wires at least partially cover two lateral sides of the heightened part respectively.

After manufacturing the signal wires, various film layers can be formed above the signal wires, but the manufacture processes thereof are not needed to be limited. For example, the passivation layer, the color film layer, the planarization layer, the anode layer, and the pixel defining layer may be formed with a photolithography process, the light emitting layer may be manufactured with an evaporation or ink-jet printing method, and the cathode layer may be formed with an evaporation method, and so on. This will not be specifically described here.

In summary, the embodiments of the present disclosure have at least one of the following advantageous effects.

1. In the display substrate, the manufacturing method thereof and the display device provided in the embodiments of the present disclosure, a heightened part is disposed in the display substrate, such that an orthographic projection of the heightened part on the base substrate is located between orthographic projections of two adjacent sub-pixels on the base substrate and between orthographic projections of two adjacent signal wires on the base substrate, while the two signal wires cover two lateral sides of the heightened part respectively. Since the signal wires typically have an opaque structure, the signal wires located on the two lateral sides of the heightened part can effectively block the light emitted from the lateral side of the light emitting layer, as a result, the light leakage phenomena between two sub-pixels can be avoided.

2. In the display substrate provided in the embodiments of the present disclosure, the heightened part is disposed between two signal wires without changing the width and thickness of other film layers, and the light-blocking effect is achieved by fully making use of the space in vertical direction of the display substrate, so it broadens the design allowance of the display substrate, and since the light leakage problem can be solved without influencing the resolution, the quality of the display image is improved.

3. In the display substrate provided in the embodiments of the present disclosure, a side of the passivation layer away from the base substrate, corresponding to the heightened part, is aligned with a side of the color film layer away from the base substrate. This structure is beneficial for improving the flatness of the upper planarization layer in the deposition, solving the problem of poor flatness due to height difference in the vertical direction. Meanwhile, the morphologies of the deposited anode layer and the pixel defining layer can be further improved, thereby reducing the display mura and increasing the yield of the display substrate.

4. In the display substrate provided in the embodiments of the present disclosure, the signal wires are lapped on a portion of the heightened part. In addition to a light-blocking effect, such designed signal wires increase the wire width of the signal wires, and reduce the parasitic resistance of the signal wires, which is beneficial for reducing the problems such as uneven brightness of the display image due to RC delay and resistance voltage drop.

Obviously, modifications and variations can be made by those skilled in the art without departing from the spirit and scope of the present disclosure. As such, if these modifications and variations fall within the scopes of the claims of the present application or equivalent technologies thereof, the present application is intended to encompass these modifications and variations.

What is claimed is:

1. A display substrate comprising a plurality of sub-pixels arranged in an array, wherein the display substrate further comprises a base substrate; an interlayer insulating layer, at least one heightened part and a plurality of signal wires, sequentially disposed on the base substrate; and
a passivation layer and a color film layer sequentially disposed above the plurality of signal wires, wherein the passivation layer has a portion above the heightened part, wherein a side of the portion away from the base substrate is aligned with a side of the color film layer away from the base substrate, and
wherein,
an orthographic projection of the at least one heightened part on the base substrate is located between orthographic projections of two adjacent sub-pixels on the base substrate,
two adjacent signal wires between the two adjacent sub-pixels are located on two sides of the at least one heightened part, and the two adjacent signal wires at least partially cover two lateral sides of the at least one heightened part respectively.

2. The display substrate according to claim 1, wherein the two signal wires cover a side of the heightened part away from the base substrate, and there is a gap between the two signal wires.

3. The display substrate according to claim 1, wherein the signal wire comprises at least one of the following wires:
a data wire, a power wire, or an external compensation signal wire.

4. The display substrate according to claim 1, wherein a section of the heightened part in a direction perpendicular to the base substrate has a trapezoid or rectangle shape.

5. The display substrate according to claim 1, wherein the heightened part has a thickness of 1 μm to 2 μm.

6. The display substrate according to claim 1, wherein the material for the heightened part is at least one selected from the following materials:
a polysiloxane-based material, an acrylic material, and a polyimide-based material.

7. The display substrate according to claim 1, wherein the display substrate further comprises a planarization layer, an anode layer, a pixel defining layer, a light emitting layer and a cathode layer, sequentially disposed above the color film layer, wherein
the anode layer and the light emitting layer are disposed in lamination and located in a sub-pixel region,
the pixel defining layer surrounds edges of the anode layer and the light emitting layer,
a side of the pixel defining layer close to the base substrate is aligned with a side of the anode layer close to the base substrate, and a side of the pixel defining layer away from the base substrate is aligned with a side of the light emitting layer away from the base substrate.

8. The display substrate according to claim 7, wherein the cathode layer is a reflective cathode layer.

9. The display substrate according to claim 7, wherein both the planarization layer and the cathode layer have a flat whole layer structure.

10. A display device comprising the display substrate according to claim 1.

11. The display device according to claim 10, wherein the display substrate is a bottom emitting type display device or a double-side emitting type display device.

12. A manufacturing method of a display substrate, wherein the display substrate comprises:
a plurality of sub-pixels arranged in an array, wherein the display substrate further comprises a base substrate; and an interlayer insulating layer, at least one heightened part and a plurality of signal wires, sequentially disposed on the base substrate, wherein,
an orthographic projection of the at least one heightened part on the base substrate is located between orthographic projections of two adjacent sub-pixels on the base substrate,
two adjacent signal wires between the two adjacent sub-pixels are located on two sides of the at least one heightened part, and the two adjacent signal wires at least partially cover two lateral sides of the at least one heightened part respectively,
the method, comprising:
forming an interlayer insulating layer on a base substrate;
applying a layer of heightening thin film, subjecting the heightening thin film to exposure and development processes, to form at least one heightened part;
forming a plurality of signal wires on the base substrate with the heightened part formed thereon; and
forming a plurality of sub-pixels arranged in an array on the base substrate with the plurality of signal wires formed thereon,
wherein an orthographic projection of the heightened part on the base substrate is located between orthographic projections of two adjacent sub-pixels on the base substrate, and two adjacent signal wires between the two adjacent sub-pixels are located on two sides of the heightened part, and the two adjacent signal wires at least partially cover two lateral sides of the heightened part respectively.

13. The manufacturing method according to claim 12, wherein before the forming the plurality of signal wires on the base substrate with the heightened part formed thereon, the manufacturing method further comprises a step of baking the heightened part formed to increase its hardness.

14. The manufacturing method according to claim 12, wherein before the forming the interlayer insulating layer, the manufacturing method further comprises a step of forming a thin film transistor on the base substrate.

15. The manufacturing method according to claim 12, wherein before the forming the plurality of signal wires on the base substrate with the heightened part formed thereon, the manufacturing method further comprises a step of forming an interlayer insulating layer pattern.

16. The manufacturing method according to claim 15, wherein the forming the interlayer insulating layer pattern comprises making via holes in the interlayer insulating layer.

* * * * *